US012687586B2

(12) United States Patent　(10) Patent No.:　US 12,687,586 B2
Umemoto et al.　(45) Date of Patent:　Jul. 21, 2026

(54) CONTROL DEVICE FOR SECONDARY BATTERY

(71) Applicant: DENSO CORPORATION, Kariya-city (JP)

(72) Inventors: Hisashi Umemoto, Kariya-city (JP); Yuji Yamagami, Kariya-city (JP); Shuhei Yoshida, Kariya-city (JP); Masaki Uchiyama, Kariya-city (JP)

(73) Assignee: DENSO CORPORATION, Kariya (JP)

( * ) Notice: Subject to any disclaimer, the term of this patent is extended or adjusted under 35 U.S.C. 154(b) by 438 days.

(21) Appl. No.: 18/335,123

(22) Filed: Jun. 14, 2023

(65) Prior Publication Data

US 2023/0324471 A1　Oct. 12, 2023

Related U.S. Application Data

(63) Continuation of application No. PCT/JP2021/044178, filed on Dec. 2, 2021.

(30) Foreign Application Priority Data

Feb. 17, 2021　(JP) ................................. 2021-023024

(51) Int. Cl.
　*G01R 31/392*　(2019.01)
　*G01R 31/389*　(2019.01)
　(Continued)

(52) U.S. Cl.
　CPC ......... *G01R 31/392* (2019.01); *G01R 31/389* (2019.01); *H01M 10/44* (2013.01); *H01M 10/48* (2013.01); *H01M 2220/20* (2013.01)

(58) Field of Classification Search
　CPC .................................................... G01R 31/392
　See application file for complete search history.

(56) References Cited

U.S. PATENT DOCUMENTS

2001/0028238　A1*　10/2001　Nakamura ........ H01M 10/4242
　　　　　　　　　　　　　　　　320/132
2003/0062875　A1　4/2003　Nakamura et al.
　　　　　　　　(Continued)

FOREIGN PATENT DOCUMENTS

EP　　　3617726 A1 *　3/2020　........... G01R 31/392
JP　　2000299137 A　10/2000
　　　　　　(Continued)

*Primary Examiner* — Catherine T. Rastovski
(74) *Attorney, Agent, or Firm* — Harness, Dickey & Pierce, P.L.C.

(57) ABSTRACT

A control device includes a diagnosis unit configured to diagnose a deterioration state of a secondary battery. The diagnosis unit includes: a resistance calculator configured to calculate a direct current resistance and a reaction resistance of impedance components based on an impedance measurement result of the secondary battery; an index value calculator configured to calculate an index value related to the direct current resistance and the reaction resistance; and a deterioration determination unit configured to compare the index value with a determination threshold based on an impedance characteristic at the time of normal deterioration of the secondary battery so as to determine whether a specific deterioration occurs due to charge and discharge of the secondary battery.

7 Claims, 11 Drawing Sheets

(51) Int. Cl.
    *H01M 10/44*        (2006.01)
    *H01M 10/48*        (2006.01)

(56)               References Cited

U.S. PATENT DOCUMENTS

| | | |
|---|---|---|
| 2005/0206389 A1 | 9/2005 | Nakamura et al. |
| 2005/0206390 A1 | 9/2005 | Nakamura et al. |
| 2005/0208368 A1 | 9/2005 | Nakamura et al. |
| 2005/0214633 A1 | 9/2005 | Nakamura et al. |
| 2011/0151331 A1* | 6/2011 | Sato ..................... H01M 4/667 |
| | | 29/623.5 |
| 2020/0072909 A1 | 3/2020 | Soejima et al. |
| 2023/0231209 A1 | 7/2023 | Yamagami et al. |

FOREIGN PATENT DOCUMENTS

| | | | |
|---|---|---|---|
| JP | 2016048213 A | | 4/2016 |
| JP | 2018190502 | * | 11/2018 |
| JP | 2018190502 A | | 11/2018 |
| JP | 2020034426 A | | 3/2020 |

* cited by examiner

```
                              CONTROL DEVICE                          1
20
        DIAGNOSIS UNIT              CHARGE/DISCHARGE
21        RESISTANCE                CONTROL UNIT         30
          CALCULATOR
                                   BATTERY STATE
SECONDARY                          MONITOR              40
BATTERY    22  INDEX VALUE
              CALCULATOR
10                                 MEMORY               50
23      DETERIORATION
        DETERMINER
```

FIG. 8

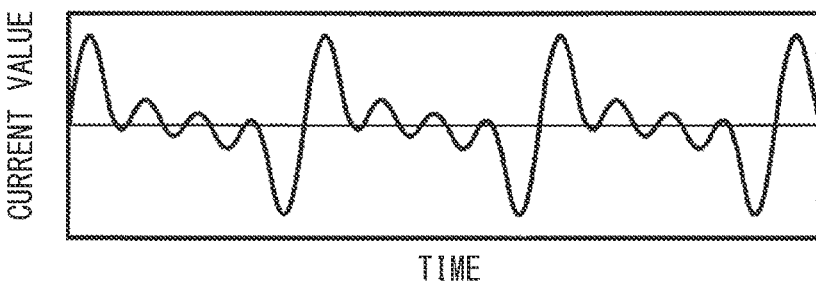

FIG. 9

```
                                                                    ┌─ 1
┌ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┐
                                    ┌─ 40    ┌──────────────────────────────┐ ┌─ 30
│   ┌──────────────────────┐            │ CHARGE/DISCHARGE CONTROL UNIT │      │
    │   BATTERY STATE      │            └──────────────────────────────┘
│   │      MONITOR         │                                      ↑         ┌─ 20 │
 41 │ ┌──────────────────┐ │ 21─┐ ┌──────────────────────────────────────────┐
│ ┌─│ │ CURRENT/VOLTAGE  │ │    │ │      RESISTANCE CALCULATOR    DIAGNOSIS UNIT│
    │ │ ACQUISITION UNIT │ │    └─│                              ┌──────────────┐
│ 42│ └──────────────────┘ │ 211─┐ ┌────────────────────────┐ 22│ INDEX VALUE  │ │
 ┌──│ ┌──────────────────┐ │     └─│ SUPERIMPOSED-CURRENT   │───│ CALCULATOR   │
│ │ │ │   TEMPERATURE    │ │       │   APPLYING UNIT        │   │  (SLOPE/     │ │
    │ │ ACQUISITION UNIT │ │       └────────────────────────┘   │  INTERCEPT)  │
│ 43│ └──────────────────┘ │ 212─┐ ┌────────────────────────┐   └──────────────┘ │
 ┌──│ ┌──────────────────┐ │     └─│     IMPEDANCE          │   ┌──────────────┐
│ │ │ │     STATE        │ │       │  MEASUREMENT UNIT      │ 23│ DETERIORATION│ │
    │ │ ESTIMATION UNIT  │ │       └────────────────────────┘───│  DETERMINER  │
│   │ │   (SOC/SOH)      │ │ 213─┐ ┌────────────────────────┐   │   (SLOPE     │ │
 50 │ └──────────────────┘ │     └─│   DC RESISTANCE        │   │  THRESHOLD   │
│ ┌──────────────────────┐ │       │ CALCULATION UNIT       │   │   TH2,       │ │
  │                      │ │ 214─┐ └────────────────────────┘   │  INTERCEPT   │
│ │       MEMORY         │◄┼─►  └─│ REACTION RESISTANCE    │   │  THRESHOLD   │ │
  │                      │ │       │ CALCULATION UNIT       │   │   TH20)      │
│ └──────────────────────┘ │       └────────────────────────┘   └──────────────┘ │
                           └────────────────────────────────────────────────────┘
└ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ─ ┘
```

CONTROL DEVICE FOR SECONDARY BATTERY

CROSS REFERENCE TO RELATED APPLICATIONS

The present application is a continuation application of International Patent Application No. PCT/JP2021/044178 filed on Dec. 2, 2021, which designated the U.S. and claims the benefit of priority from Japanese Patent Application No. 2021-023024 filed on Feb. 17, 2021. The entire disclosures of all of the above applications are incorporated herein by reference.

TECHNICAL FIELD

The present disclosure relates to a control device for a secondary battery.

BACKGROUND

As a deterioration mode of a secondary battery (such as lithium ion secondary battery) mounted on an electric vehicle or the like, a specific deterioration (such as high-rate degradation) is different from a normal deterioration due to aging.

SUMMARY

According to an aspect of the present disclosure, a control device for a secondary battery including an electrode and an electrolyte, the control device includes: a diagnosis unit configured to diagnose a deterioration state of the secondary battery. The diagnosis unit has: a resistance calculator configured to calculate a direct current resistance and a reaction resistance based on an impedance measurement result of the secondary battery by an alternating current impedance method; an index value calculator configured to calculate an index value related to the direct current resistance and the reaction resistance; and a deterioration determination unit configured to compare the index value with a determination threshold based on an impedance characteristic at a time of normal deterioration of the secondary battery so as to determine a specific deterioration associated with charging and discharging of the secondary battery.

BRIEF DESCRIPTION OF DRAWINGS

FIG. 8 is a conceptual diagram illustrating a current of a multiple sine wave applied to the secondary battery in the diagnosis unit of the control device according to the first embodiment.

FIG. 9 is a block diagram illustrating a control device for a secondary battery according to a second embodiment.

DETAILED DESCRIPTION

Figures 1, 2:
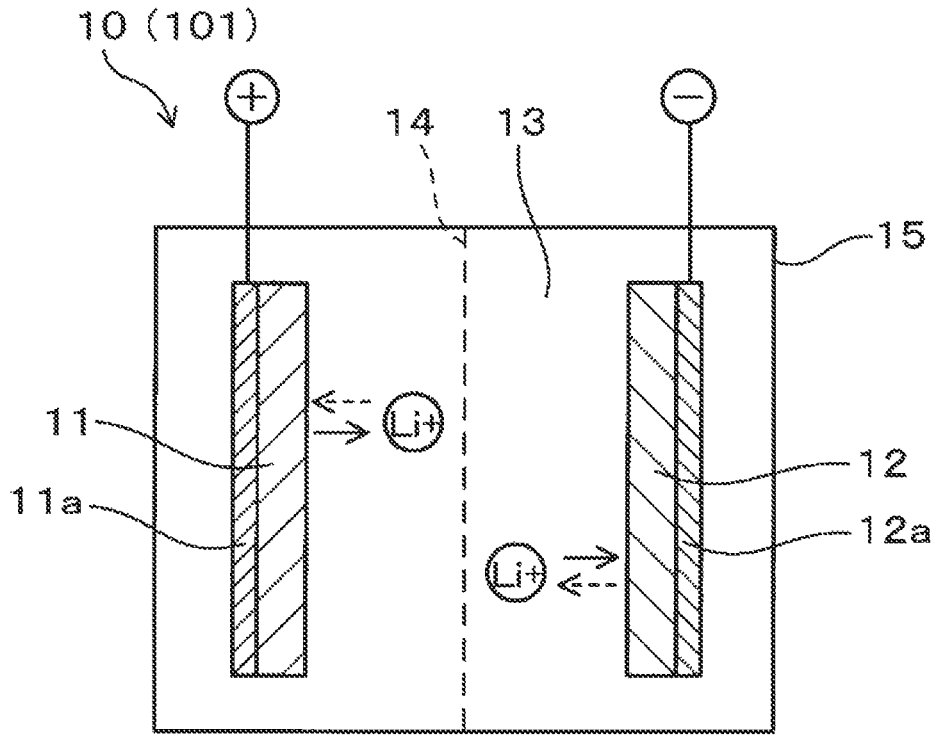
FIG. 1 is a block diagram illustrating a control device for a secondary battery according to a first embodiment.
FIG. 2 is a diagram illustrating a schematic configuration of a secondary battery of the first embodiment.

As a deterioration mode of a secondary battery (such as lithium ion secondary battery) mounted on an electric vehicle or the like, a specific deterioration (such as high-rate degradation) different from a normal deterioration due to aging is known. In order to improve the safety of the secondary battery, it is desired to promptly detect the occurrence of the specific deterioration and suppress the progress thereof.

It is considered that the high-rate deterioration is a temporary increase in internal resistance that is observed when a charging/discharging operation is performed at a high input/output value, and is caused by the occurrence of a bias of the electrolytic solution inside the battery. Regarding the detection and control of the high-rate deterioration, there is a system in which a DC resistance of a secondary battery is acquired from an AC impedance of the secondary battery measured by a measurement device, and a state of high-rate deterioration is estimated using a difference between the measured DC resistance and an initial DC resistance of the secondary battery. The initial DC resistance is obtained from a correspondence relationship with a temperature stored in advance. When a high-rate deterioration is determined, a control for suppressing the charge/discharge current of the secondary battery is performed.

In the system, among impedance components of the secondary battery, a change in DC resistance is used as an index indicating the progress of high-rate deterioration. Specifically, in the complex impedance plot of the measurement result of the AC impedance, the DC resistance represented as a start point of an arc is obtained. A difference between the measured DC resistance and the initial DC resistance (that is, a shift amount of the start point) corresponds to a high-rate deterioration trigger. When a magnitude of the difference is equal to or greater than a predetermined reference value, the high-rate deterioration is determined.

The above-described system is based on the premise that there is no change in the DC resistance at the time of deterioration due to normal aging. However, according to the study by the inventors, it is found that even during normal deterioration, an increase in DC resistance may be observed due to formation of a solid electrolyte interphase (SEI) film on the surface of the electrode active material. In this case, it is difficult to accurately distinguish between the normal deterioration and the high-rate deterioration, and there is a possibility that the deterioration is erroneously diagnosed as the high-rate deterioration even in a state where the normal deterioration progresses.

The present disclosure provides a control device for a secondary battery capable of improving safety by improving accuracy of deterioration diagnosis.

According to an aspect of the present disclosure, a control device for a secondary battery has a diagnosis unit configured to diagnose a deterioration state of the secondary battery including an electrode and an electrolyte. The diagnosis unit has: a resistance calculator configured to calculate a direct current resistance and a reaction resistance based on an impedance measurement result of the secondary battery by an alternating current impedance method; an index value calculator configured to calculate an index value related to the direct current resistance and the reaction resistance; and a deterioration determination unit configured to compare the index value with a determination threshold based on an impedance characteristic at a time of normal deterioration of the secondary battery so as to determine a specific deterioration associated with charging and discharging of the secondary battery.

In the control device for a secondary battery, the diagnosis unit diagnoses the occurrence of specific deterioration associated with the charging and discharging by using the index value related to the direct current resistance and the reaction resistance calculated by the resistance calculator. The increase in resistance at the time of the specific deterioration is mainly caused by the direct current resistance of the impedance components, and the reaction resistance is less likely to change. This relationship is unique at the time of specific deterioration, and is different from the relationship between the direct current resistance and the reaction resistance at the time of normal deterioration. It is possible to determine the occurrence of the specific deterioration by using this relationship, since the deterioration determination unit compares it with the index value calculated by the index value calculator by setting a determination threshold in advance so as to be distinguished from the normal deterioration.

According to the above configuration, it is possible to provide a control device for a secondary battery capable of improving the safety by improving the accuracy of deterioration diagnosis.

First Embodiment

An embodiment of a control device for a secondary battery will be described with reference to FIGS. 1 to 8. As shown in FIG. 1, the control device 1 of the present embodiment includes a diagnosis unit 20 that diagnoses the state of deterioration of the secondary battery 10. The diagnosis unit 20 includes a resistance calculator 21, an index value calculator 22, and a deterioration determiner 23.

As shown in FIG. 2, the secondary battery 10 includes an electrode 11, 12 and an electrolytic solution 13.

In the diagnosis unit 20, the resistance calculator 21 calculates a direct current (DC) resistance Rs and a reaction resistance Rct from the impedance measurement result of the secondary battery 10 by the AC impedance method. The index value calculator 22 calculates an index value related to the DC resistance Rs and the reaction resistance Rct calculated by the resistance calculator 21. As the index value, for example, a relationship between the DC resistance Rs and the reaction resistance Rct or a value representing a change in the DC resistance Rs and the reaction resistance Rct can be adopted.

The deterioration determiner 23 compares the index value calculated by the index value calculator 22 with a determination threshold based on the impedance characteristic at the time of normal deterioration of the secondary battery 10, so as to determine whether a specific deterioration associated with charging and discharging of the secondary battery 10 has occurred. The specific deterioration is, for example, high-rate deterioration. The determination threshold can be set according to the index value to be employed.

In the present embodiment, a ratio Rs/Rct of the DC resistance Rs and the reaction resistance Rct is used as an example of the index value for the deterioration determination. As a determination threshold in the deterioration determiner 23, a ratio threshold TH1 is used, which is set based on the ratio Rs/Rct between the DC resistance Rs and the reaction resistance Rct at the time of normal deterioration. When the calculated ratio Rs/Rct is equal to or greater than the ratio threshold TH1, the deterioration determiner 23 can determine that the specific deterioration has occurred.

In the present embodiment, the control device 1 further includes a charge/discharge control unit 30 that controls charge and discharge of the secondary battery 10. The charge/discharge control unit 30 can limit the charge/discharge current when the deterioration determiner 23 determines that the specific deterioration has occurred. In addition, the control device 1 includes a battery state monitor 40 and a memory 50 to use at the time of normal control and at the time of deterioration diagnosis by the diagnosis unit 20. The battery state monitor 40 monitors the state of the secondary battery 10, and the memory 50 stores programs and characteristic data necessary for the control by the control device 1.

Figure 3:
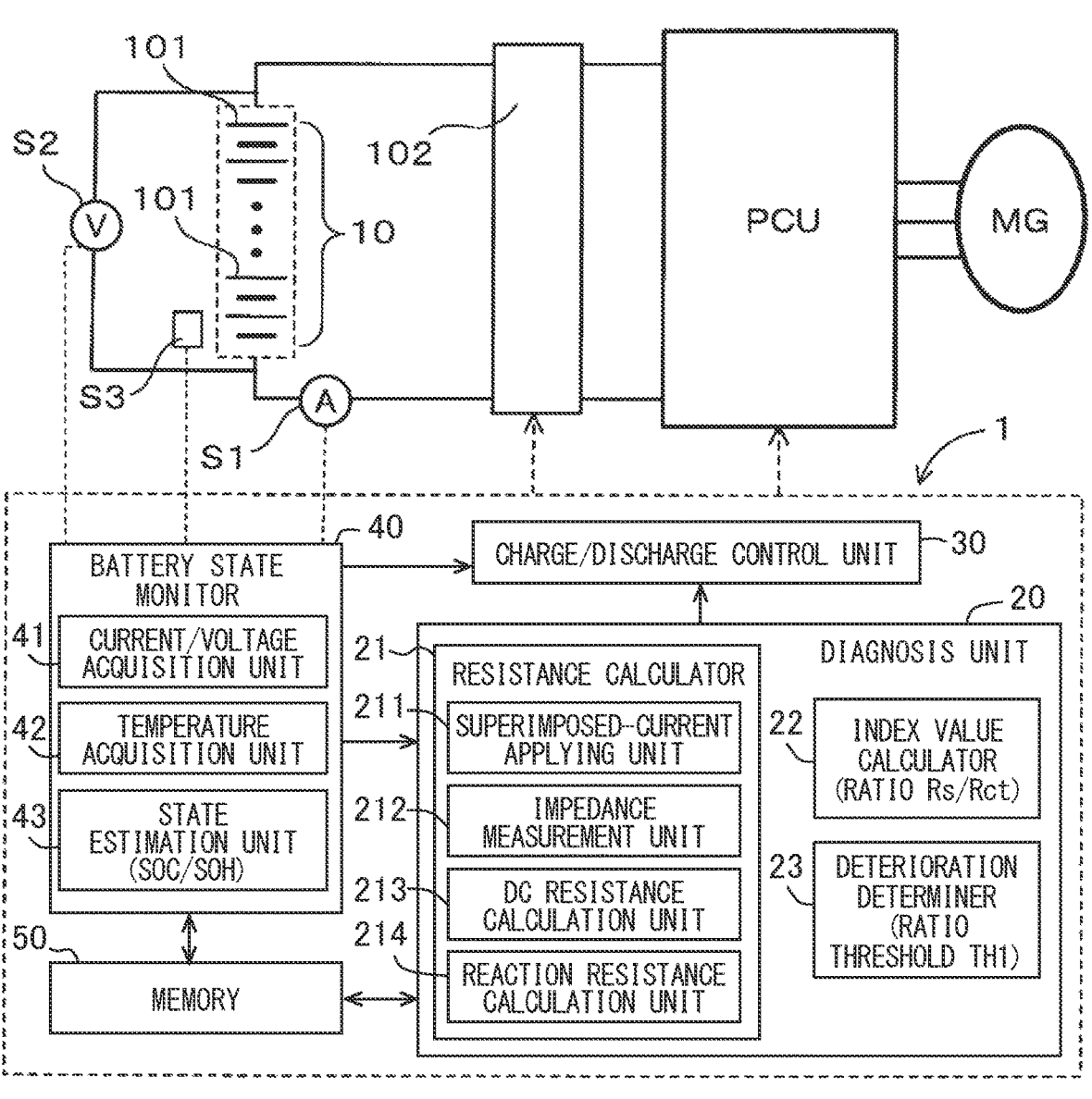
FIG. 3 is a schematic configuration diagram illustrating the control device of the first embodiment applied for a secondary battery of a vehicle.

Hereinafter, the control device 1 of the secondary battery 10 of the present embodiment will be described in detail. As illustrated in FIG. 3, the control device 1 is mounted and used in the vehicle together with the secondary battery 10. The control device 1 includes the diagnosis unit 20, the charge/discharge control unit 30, the battery state monitor 40, and the memory 50. The secondary battery 10 is, for example, a lithium ion secondary battery and constitutes a power supply unit of the vehicle such as an electric vehicle or a hybrid vehicle. Specifically, the secondary battery 10 is connected to an in-vehicle motor generator (MG) via a switch circuit unit 102 and a power control unit (PCU), and is capable of supplying electric power for driving the MG and recovering electric power generated during regeneration.

The secondary battery 10 constitutes a battery module in which unit cells (or single cells, hereinafter, simply referred to as cells) 101 are connected in series. The secondary battery 10 is provided with a current sensor S1, a voltage sensor S2, and a temperature sensor S3, and detection signals of the sensors are output to the battery state monitor 40. The battery state monitor 40 includes a current/voltage acquisition unit 41, a temperature acquisition unit 42 and a state estimation unit 43. The current/voltage acquisition unit 41 acquires detection signals of the sensors S1, S2. The temperature acquisition unit 42 acquires detection signals of the sensor S3. The state estimation unit 43 estimates a state of charge or a state of deterioration of the secondary battery 10 based on the acquired values. The state estimation unit 43 calculates state quantities such as a state of charge (SOC) indicating a remaining battery level of the secondary battery 10 and a state of health (SOH) indicating a deterioration amount of the secondary battery 10. The SOH is represented by, for example, a ratio of the full charge capacity at the time of deterioration to the full charge capacity in the initial state.

The configuration of the battery module of the secondary battery 10 and the arrangement of the sensors are conceptual, and are arbitrarily set according to the application and the like. The number of cells of the battery module is not particularly limited. Plural battery modules may be connected in parallel or in series to form the secondary battery 10, or the sensor may be provided for each of the cells 101.

The state estimation unit 43 estimates the state quantity using various methods. For example, a relationship with an open circuit voltage (OCV) of the secondary battery 10 or a relationship with an integrated value of a charge/discharge current is used to estimate the SOC. The SOH is estimated using the relationship of the integrated current amount and the temperature indicating the battery state and the usage environment. Specifically, characteristic data representing these relationships is acquired in advance and stored in the memory 50 as a map value or a relational expression. The SOC or the SOH can be estimated based on the values acquired by the sensors.

The switch circuit unit 102 is interposed between the secondary battery 10 and the PCU. The switch circuit unit 102 includes a charge switch that is turned on when the MG is driven (discharged) or power is generated (charged), and a discharge switch that is turned on when power is generated (charged). The PCU is configured as a power conversion device including an inverter that converts DC power of the secondary battery 10 into AC power, a step-up/step-down converter, and the like. The charge/discharge control unit 30 controls the opening and closing of the charge/discharge switch of the switch circuit unit 102 and the operation of the PCU. The charge/discharge control unit 30 outputs a control signal to the switch circuit unit 102 and the PCU in accordance with the SOC and the SOH estimated by the battery state monitor 40 such that the charge power or the discharge power of the secondary battery 10 is within an allowable range.

As schematically shown in FIG. 2, each of the cells 101 of the secondary battery 10 includes a positive electrode 11, a negative electrode 12, an electrolytic solution 13 which is an electrolyte, and a separator 14 disposed between the electrodes. The positive electrode 11 includes, for example, a lithium composite oxide containing lithium and a transition metal such as Ni, Co, Fe, or Mn as a positive electrode active material. The negative electrode 12 includes, for example, a carbon-based material such as graphite as a negative electrode active material. As the electrolytic solution 13, for example, a nonaqueous electrolytic solution in which a lithium salt is dissolved in a solvent such as ethylene carbonate is used. The separator 14 is formed of a porous film capable of electrically insulating the positive electrode 11 and the negative electrode 12 from each other.

Each of the cells 101 of the secondary battery 10 is held in the case 15 and is electrically connected to an external circuit by a positive electrode terminal and a negative electrode terminal taken out to the outside of the case. In the case, the positive electrode terminal is connected to one end of a positive electrode current collector 11a provided integrally with the positive electrode 11 of each cell 101, and the negative electrode terminal is connected to one end of a negative electrode current collector 12a provided integrally with the negative electrode 12. The positive electrode current collector 11a and the negative electrode current collector 12a are made of, for example, a metal foil or the like.

During charging of the secondary battery 10, lithium contained in the positive electrode 11 is dissolved in the electrolytic solution 13. Lithium ions move in the electrolytic solution 13, are inserted into the negative electrode 12, and are held in the negative electrode active material. On the other hand, at the time of discharge, lithium ions are desorbed from the negative electrode 12, move in the electrolytic solution 13, are inserted into the positive electrode 11, and are held in the positive electrode active material. The deterioration modes of the secondary battery 10 include a normal deterioration in which the internal resistance increases due to repetition of charge and discharge over time and a specific deterioration.

The normal deterioration is irreversible deterioration caused by a change in the electrode structure, decomposition of the electrolytic solution 13, or the like, and the deterioration progresses with time. In contrast, the specific deterioration is reversible deterioration indicating a temporary increase in internal resistance, and recovery from the deteriorated state is possible. The high-rate deterioration, which is an example of the specific deterioration, is a phenomenon that occurs when a charging operation at a high input value or a discharging operation at a high output value is conducted in biased manner. The internal resistance increases due to the distribution in the lithium ion concentration in the electrolytic solution 13. When the charging and discharging operation is stopped, the bias of the electrolytic solution 13 is alleviated with the passage of time, and the high-rate deterioration state is cancelled. When the high-rate deterioration progresses, for example, lithium deposition or the like in the negative electrode 12 may occur. It is desirable to promptly detect the high-rate deterioration and perform control for suppressing the progress of the high-rate deterioration.

In FIG. 3, the control device 1 includes the diagnosis unit 20 that diagnoses such a state of deterioration, so as to appropriately control charging and discharging in accordance with the state of deterioration so that the secondary battery 10 can be used safely. Specifically, the diagnosis unit 20 distinguishes the progress of the high-rate deterioration, which is the specific deterioration, from the normal deterioration by using the fact that the relationship between the DC resistance and the reaction resistance obtained by the impedance measurement differs depending on the state of deterioration. Therefore, the diagnosis unit 20 includes the resistance calculator 21, the index value calculator 22, and the deterioration determiner 23, so as to perform diagnosis based on a control flow (see FIG. 7).

Figures 4, 5:
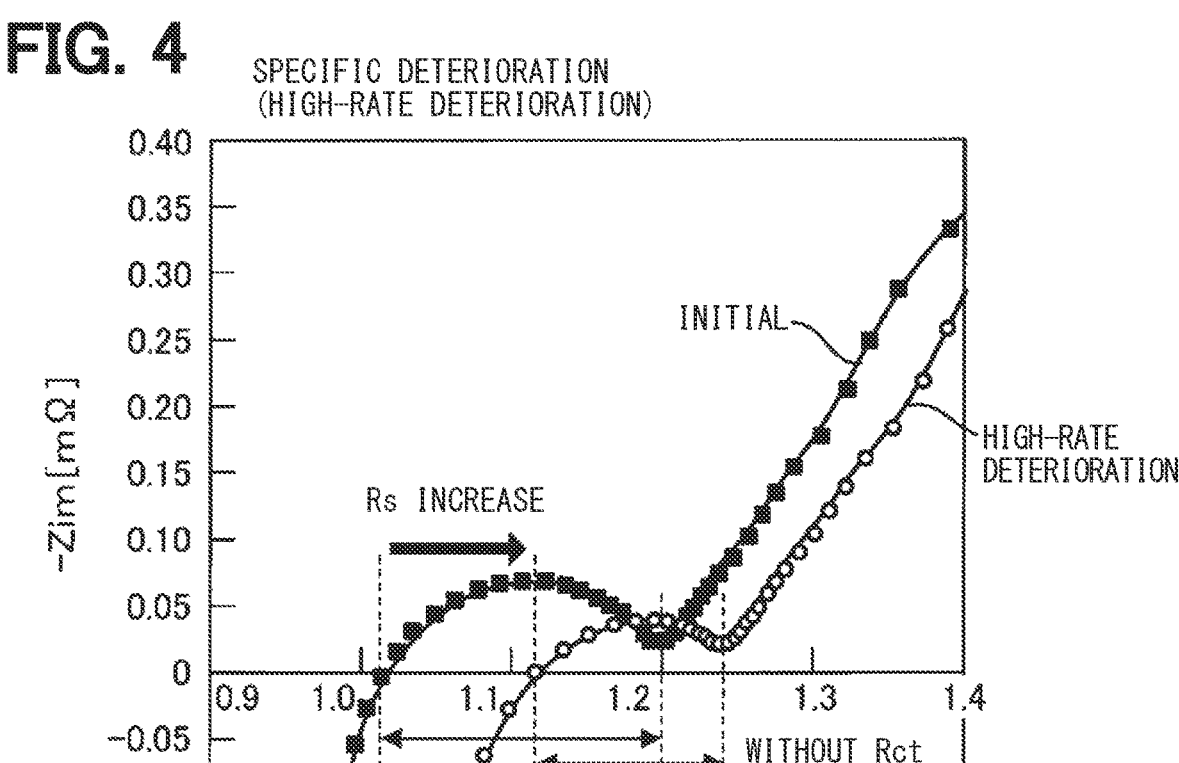
FIG. 4 is a complex impedance plot showing an example of impedance characteristics at the time of specific deterioration of the secondary battery according to the first embodiment.
FIG. 5 is a complex impedance plot showing an example of impedance characteristics at the time of normal deterioration of the secondary battery according to the first embodiment.

FIG. 4 shows a result of measurement of the AC impedance at the time of high-rate deterioration as a complex impedance plot (Cole-Cole plot) with the real component Zre on the horizontal axis and the imaginary component Zim on the vertical axis in comparison with the initial state. The resistance component of the internal impedance includes the DC resistance Rs represented by a magnitude from the origin to the intersection with the real axis, and the reaction resistance Rct represented by a magnitude of an arc portion starting from the intersection. The DC resistance Rs reflects a change in the resistance of the electrolytic solution 13 during charging and discharging. The reaction resistance Rct includes a resistance associated with the reaction at the interface between the electrolytic solution 13 and the electrode active material. As shown in FIG. 4, when there is no deterioration over time from the initial state, an increase in resistance due to the high-rate deterioration appears as an increase in DC resistance Rs of the resistance components, and an increase in reaction resistance Rct is not observed.

As shown in FIG. 5, in the complex impedance plot at the time of normal deterioration, the increase in the reaction resistance Rct is larger than that in the initial state, and the increase in the DC resistance Rs is relatively small. If the solid electrolyte interphase (SEI) film on the surface of the electrode active material grows over time, when lithium ions enter and exit the SEI film, there is a volume change due to expansion and contraction. The reason why the increase in the DC resistance Rs is observed is presumed to be that it is likely to cause deviation of the electrolytic solution 13 due to the volume change.

Figure 6:
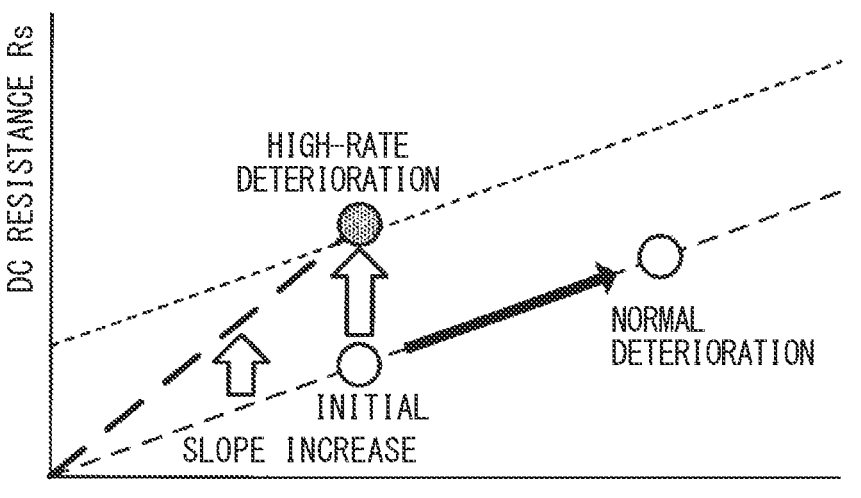
FIG. 6 is a graph showing a relationship between a DC resistance and a reaction resistance at the time of normal deterioration and at the time of specific deterioration of the secondary battery in the first embodiment.

At this time, as shown in FIG. 6, the relationship between the DC resistance Rs and the reaction resistance Rct changes depending on the deterioration state. That is, the relationship between the DC resistance Rs and the reaction resistance Rct at the time of normal deterioration changes substantially linearly (see FIG. 6), and the DC resistance Rs and the reaction resistance Rct increase with the passage of time. In contrast, at the time of high-rate deterioration, only the DC resistance Rs increases when the high-rate deterioration occurs from the initial state. That is, the characteristic line at the time of normal deterioration changes so as to shift to the side where the DC resistance Rs increases (see FIG. 6).

Therefore, by using an index value representing these relationships, the normal deterioration and the high-rate deterioration can be distinguished from each other. For example, since the increase in the DC resistance Rs with respect to the increase in the reaction resistance Rct becomes large at the time of high-rate deterioration, the ratio Rs/Rct of the DC resistance Rs and the reaction resistance Rct can be used as the index value. Alternatively, as shown in FIG. 6, since a slope of a straight line passing through the origin, which indicates the relationship between the DC resistance Rs and the reaction resistance Rct at the time of high-rate deterioration increases with respect to a slope of the characteristic line at the time of normal deterioration, the value of this slope can be used as the index value.

The initial state illustrated in FIG. 6 is, for example, a state of the secondary battery 10 at the time of factory shipment, and the deteriorated state can be a state in which the secondary battery 10 is used to some extent and a resistance change occurs. In addition, the characteristic lines in FIG. 6 simply show the relationship between the DC resistance Rs and the reaction resistance Rct, and do not necessarily show that the relationship between the DC resistance Rs and the reaction resistance Rct changes linearly, as shown in FIG. 6, due to deterioration.

In the diagnosis unit 20, the resistance calculator 21 calculates the DC resistance Rs and the reaction resistance Rct based on the calculation results of the impedances (at least two points or more) at the plural measurement frequencies. The index value calculator 22 calculates the ratio Rs/Rct of the DC resistance Rs and the reaction resistance Rct as an index value representing the relationship. The deterioration determiner 23 sets in advance a ratio threshold TH1 capable of distinguishing between the high-rate deterioration and the normal deterioration, and compares the calculated index value with the ratio threshold based on the relationship shown in FIGS. 4 to 6.

Specifically, the resistance calculator 21 includes a superimposed current applying unit 211, an impedance measurement unit 212, a DC resistance calculation unit 213, and a reaction resistance calculation unit 214. The superimposed current applying unit 211 applies a superimposed current obtained by superimposing plural frequency components to the secondary battery 10. By using the superimposed current, it is possible to collectively acquire battery voltages when currents of plural frequencies are applied.

Preferably, a multiple sine wave shown in FIG. 8 can be adopted as the superimposed current. As the superimposed current, a rectangular wave, a sawtooth wave, and a triangular wave can be used. However, the current value of the harmonic with respect to the fundamental frequency as the superimposed frequency is significantly reduced as the order increases, whereas the current value is not reduced in the case of the multiple sine wave. Thus, the measurement accuracy can be maintained as high. In the multiple sine wave, the superimposed frequency is not particularly limited, and can be arbitrarily set in a frequency region corresponding to the DC resistance Rs and the reaction resistance Rct.

In the resistance calculator 21, the configuration of the current supply unit is not limited, and plural measurement frequencies or a superimposed current obtained by superimposing the measurement frequencies can be generated by using, for example, a power conversion device included in an in-vehicle PCU. In this way, it is not necessary to separately provide an impedance measurement device including a superimposed current generation unit for calculating resistance, and a superimposed current of a large current can be generated. Therefore, a device configuration suitable for on-board diagnosis of the secondary battery 10 can be obtained. Alternatively, it is also possible to adopt a configuration in which the superimposed current generation unit is disposed in an on-vehicle charging device or external charging device (not illustrated).

The impedance measurement unit 212 acquires the current value of the superimposed current applied to the secondary battery 10 by the superimposed current applying unit 211, acquires the battery voltage when the superimposed current is applied to the secondary battery 10, and calculates the impedance for each of the frequency components by using the discrete Fourier transform. As the current value and the battery voltage at the time of applying the superimposed current, detection values of the current sensor S1 and the voltage sensor S2 can be used, and a fast discrete Fourier transform (FFT) can be adopted as the discrete Fourier transform.

The DC resistance calculation unit 213 and the reaction resistance calculation unit 214 calculate the DC resistance Rs and the reaction resistance Rct from the complex impedance plot based on the impedance for each frequency component. Specifically, as shown in FIG. 4, the value of the intersection of the real axis and the arc portion is acquired as the DC resistance Rs, and the magnitude of the arc portion starting from the intersection is acquired as the reaction resistance Rct.

The index value calculator 22 calculates the ratio Rs/Rct between the DC resistance Rs and the reaction resistance Rct as an index value representing the relationship between these acquired values. The deterioration determiner 23 can determine whether a high-rate deterioration has occurred by comparing the obtained ratio Rs/Rct with a preset ratio threshold TH1.

Figure 7:
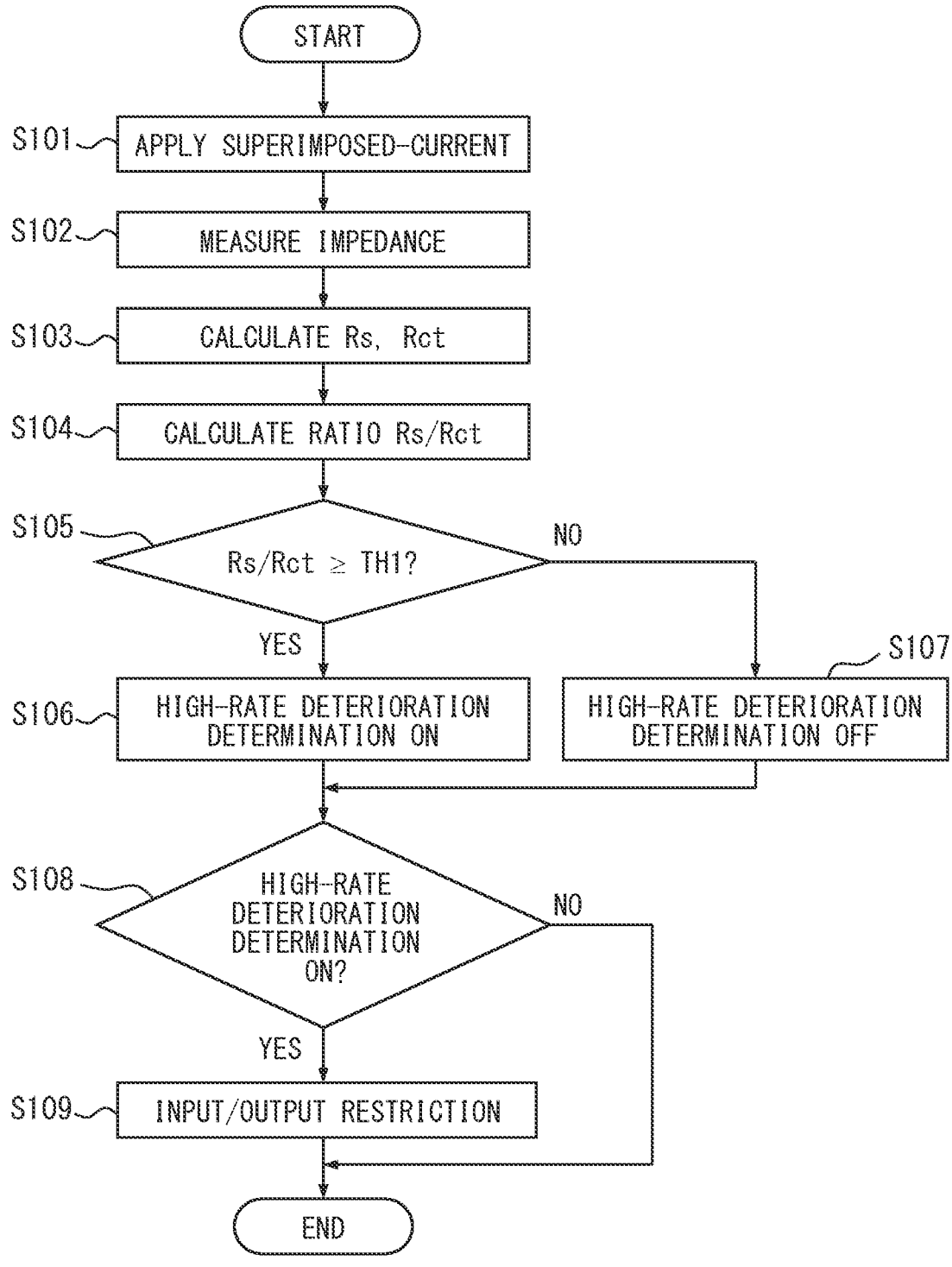
FIG. 7 is a flowchart illustrating a diagnosis procedure in a diagnosis unit of the control device according to the first embodiment.

Next, a control flow of deterioration diagnosis of the secondary battery 10 performed by the diagnosis unit 20 of the control device 1 of the present embodiment will be described with reference to FIG. 7. First, in S101, the superimposed current applying unit 211 of the resistance calculator 21 applies a superimposed current in which frequency components are superimposed to the secondary battery 10. The waveform of the superimposed current can be a multiple sine wave, and the current value of each superimposed component can be maintained to restrict a decrease in measurement accuracy.

The applied current desirably includes a frequency component having a C (capacity) rate of ¹⁄₁₀ C or more when the capacity of the secondary battery 10 to be diagnosed is C. This is based on a test result in which a measurement variation when the applied current is changed in a range of 0 to ⁵⁄₁₀ C rate is compared with a measurement variation in a conventional impedance measuring device. A measurement accuracy equal to or higher than that in the conventional impedance measuring device can be obtained at a C rate of ¹⁄₁₀ C or higher. Preferably, it is desirable that the superimposed current to be applied includes a frequency component having a C rate of ²⁄₁₀ C or more, such that the measurement accuracy can be further improved. The frequency components are set so as to include a frequency region necessary for calculating the DC resistance Rs and the reaction resistance Rct, and it is desirable that the ratio of the lowest frequency to the highest frequency is 50 or more.

Next, in S102, the impedance measurement unit 212 acquires the battery voltage when currents of plural frequencies are applied, and calculates the impedance from the complex impedance plot. Specifically, the current value and the voltage value acquired by the battery state monitor 40 are separated by frequency components and acquired as complex vectors I(ω) and V(ω), respectively, and a complex impedance plot is created based on the following Equations 1 and 2.

$$Z=|I(\omega)|/|V(\omega)|, \text{ and } \cos\theta=I\cdot V/|I||V| \tag{Equation 1}$$

$$Zre=Z\cos\theta, \text{ and } Zim=Z\sin\theta. \tag{Equation 2}$$

Further, in S103, the DC resistance Rs and the reaction resistance Rct are calculated from the complex impedance plot by the DC resistance calculation unit 213 and the reaction resistance calculation unit 214. Then, in S104, the ratio Rs/Rct is calculated.

Then, in S105, the deterioration determiner 23 determines the presence or absence of high-rate deterioration based on whether or not the calculated ratio Rs/Rct is equal to or greater than the ratio threshold TH1 (Rs/Rct≥TH1?). The ratio threshold TH1 is appropriately set so as to be equal to or less than a possible value of the ratio Rs/Rct at the time of high-rate deterioration and larger than a possible value of the ratio Rs/Rct at the time of normal deterioration. For example, the ratio threshold TH1 is appropriately set between the minimum value of the ratio Rs/Rct at the time of high-rate deterioration and the maximum value of the ratio Rs/Rct at the time of normal deterioration.

Table 1 shows an example of the DC resistance Rs, the reaction resistance Rct, and the calculated value of the ratio Rs/Rct at the time of normal deterioration, which are obtained by performing a normal cycle test and a storage test. Table 2 shows an example of the DC resistance Rs, the reaction resistance Rct, and the calculated value of the ratio Rs/Rct at the time of high-rate deterioration, which are obtained by performing a high-rate deterioration test. The high-rate deterioration test is a charge/discharge test in which one of a charge current and a discharge current is set to be large. The impedance measurement is periodically performed from the initial stage to the end of life in each deterioration test, and the changes in each calculated value are shown in Tables 1 and 2 so as to be compared with each other. Tables 1 and 2 show values at 25° C. and SOC of 50%.

TABLE 1

| Normal deterioration | Rs[mΩ] | Rct[mΩ] | Rs/Rct |
|---|---|---|---|
| 1 (Initial) | 0.93 | 0.48 | 1.95 |
| 2 | 0.98 | 0.50 | 1.98 |
| 3 | 1.04 | 0.52 | 2.00 |
| 4 | 1.10 | 0.54 | 2.03 |
| 5 | 1.15 | 0.56 | 2.05 |
| 6 | 1.21 | 0.58 | 2.07 |
| 7 (End of life) | 1.26 | 0.60 | 2.09 |

TABLE 2

| High-rate deterioration | Rs[mΩ] | Rct[mΩ] | Rs/Rct |
|---|---|---|---|
| 1 (Initial) | 1.02 | 0.48 | 2.15 |
| 2 | 1.08 | 0.50 | 2.16 |
| 3 | 1.14 | 0.52 | 2.17 |
| 4 | 1.20 | 0.54 | 2.19 |
| 5 | 1.27 | 0.56 | 2.20 |
| 6 | 1.33 | 0.58 | 2.21 |
| 7 (End of life) | 1.39 | 0.60 | 2.23 |

As shown in Tables 1 and 2, the DC resistance Rs and the reaction resistance Rct increase as the deterioration progresses from the initial state in both the normal deterioration and the high-rate deterioration. There is no difference in the reaction resistance Rct between the normal deterioration and the high-rate deterioration. In contrast, the reaction resistance Rct at the time of high-rate deterioration is larger than that at the time of normal deterioration even in an equivalent deterioration state over time. Therefore, the ratio Rs/Rct at the time of high-rate deterioration is in the range of 2.15 to 2.23, which is larger than the range of 1.95 to 2.09 of the ratio Rs/Rct at the time of normal deterioration.

From this result, the ratio threshold TH1 can be set to a value that is equal to or less than the range of the ratio Rs/Rct at the time of high-rate deterioration and is larger than the range of the ratio Rs/Rct at the time of normal deterioration, preferably, a value between these ranges (such as 2.10). Accordingly, the ratio threshold TH1 is smaller than the minimum value of the ratio Rs/Rct at the time of high-rate deterioration and larger than the maximum value of the ratio Rs/Rct at the time of normal deterioration. Thus, a high-rate deterioration can be accurately detected separately from a normal deterioration.

The setting value of the ratio threshold TH1 may be changed in consideration of the battery state monitored by the battery state monitor 40. Since the ratio Rs/Rct, which is the index value, is affected by, for example, a change in the surrounding environment such as temperature or a change in the state quantity such as SOC or SOH, it is possible to reduce an error in the calculation of the index value by determining the ratio threshold TH1 using one or more of these as a parameter.

Specifically, when the SOC/SOH is at a similar level, the ratio Rs/Rct increases as the temperature increases. Therefore, a range of the ratio Rs/Rct at each temperature may be obtained by performing a test in advance, a ratio threshold map or the like for each temperature may be created. In this case, the ratio threshold TH1 is set according to the temperature acquired by the temperature acquisition unit 42. When the temperature/SOH is at a similar level, the ratio Rs/Rct becomes smaller at a low SOC (such as 10% or less) or a high SOC (such as 90% or more). Also in this case, a map or the like may be created in the same manner, and the ratio threshold TH1 may be set according to the SOC estimated by the state estimation unit 43.

When an affirmative determination is made in S105, a determination flag of high-rate deterioration is turned on in S106, and the process proceeds to S108. When a negative determination is made in S105, a determination flag of high-rate deterioration is turned off in S107, and the process proceeds to S108. In S108, it is determined whether the determination flag of high-rate deterioration is on (high-rate deterioration determination ON?). When the determination is affirmative in S108, the processor proceeds to S109. When a negative determination is made in S108, the control flow ends.

When the processor proceeds to S109, since the high-rate deterioration determination is in the ON state and it is determined that the high-rate deterioration is present, the input/output restriction is performed. Specifically, the charge/discharge control unit 30 controls the charge/discharge operation so as to limit the upper limit value of the input/output current, thereby suppressing the progress of the high-rate deterioration. Thereafter, the control flow ends.

According to the control device 1 of the present embodiment, the presence or absence of the high-rate deterioration of the secondary battery 10 can be accurately diagnosed separately from the normal deterioration by using the index value representing the relationship between the DC resistance Rs and the reaction resistance Rct, and the determination threshold. By performing charge/discharge control when the high-rate deterioration is detected, the safety can be improved. In addition, by using the superimposed current for impedance measurement, it is possible to increase the diagnosis speed and simplify the configuration for deterioration diagnosis as compared with a case where currents of plural frequencies are sequentially applied.

The method of using the ratio Rs/Rct which is an index value and the ratio threshold TH1 which is a determination threshold according to the present embodiment can be used not only for high-rate deterioration diagnosis of the entire secondary battery 10 but also for high-rate deterioration diagnosis for each cell of the battery module or for each battery module when plural battery modules are included. In any case, by obtaining the impedance based on the battery current and the battery voltage for each unit to be diagnosed and calculating the index value, it is possible to perform high-rate deterioration diagnosis with high accuracy in the same manner.

Second Embodiment

Next, the second embodiment of the control device 1 for the secondary battery 10 will be described with reference to FIGS. 9 to 12. The control device 1 of the present embodiment illustrated in FIG. 9 includes the diagnosis unit 20, the charge/discharge control unit 30, the battery state monitor 40, and the memory 50, similarly to the first embodiment. The diagnosis unit 20 includes the resistance calculator 21, the index value calculator 22, and the deterioration determiner 23. The basic configuration of a system in which the control device 1 is mounted on a vehicle together with the secondary battery 10 is the same as that of the first embodiment, and illustration thereof is omitted. Hereinafter, the differences will be mainly described.

Those of reference numerals used in the second and subsequent embodiments which are the same reference numerals as those used in the previous embodiment denote the same components as in the previous embodiments unless otherwise indicated.

In the present embodiment, the configuration of the secondary battery 10 is similar to that of the first embodiment, as a battery module in which the cells 101 are combined, each of which includes the positive electrode 11, the negative electrode 12 and the electrolytic solution 13. The diagnosis unit 20 determines the presence or absence of high-rate deterioration by acquiring and comparing the impedances of the cells 101 of the secondary battery 10. The resistance calculator 21 includes the superimposed current applying unit 211, the impedance measurement unit 212, the DC resistance calculation unit 213, and the reaction resistance calculation unit 214, and calculates the DC resistance Rs and the reaction resistance Rct for each of the cells 101 in the same manner as in the first embodiment.

The index value calculator 22 uses, as an index value representing the relationship between the DC resistance Rs and the reaction resistance Rct, a value representing the relationship between plural sets of the DC resistance Rs and the reaction resistance Rct calculated for each of the cells 101. Specifically, a slope or an intercept of an equation representing a relationship between the sets of the DC resistance Rs and the reaction resistance Rct can be used. In the deterioration determiner 23, the determination threshold corresponding to the index value is set based on an expression representing the relationship between the DC resistance Rs and the reaction resistance Rct in the cells 101 at the time of normal deterioration. When the index value is the slope of the expression, the slope threshold TH2 is used. When the index value is the intercept, the intercept threshold TH20 is used. When the slope is equal to or less than the slope threshold TH2 or when the intercept is equal to or more than the intercept threshold TH20, the deterioration determiner 23 determines that the specific deterioration has occurred.

Figure 10:
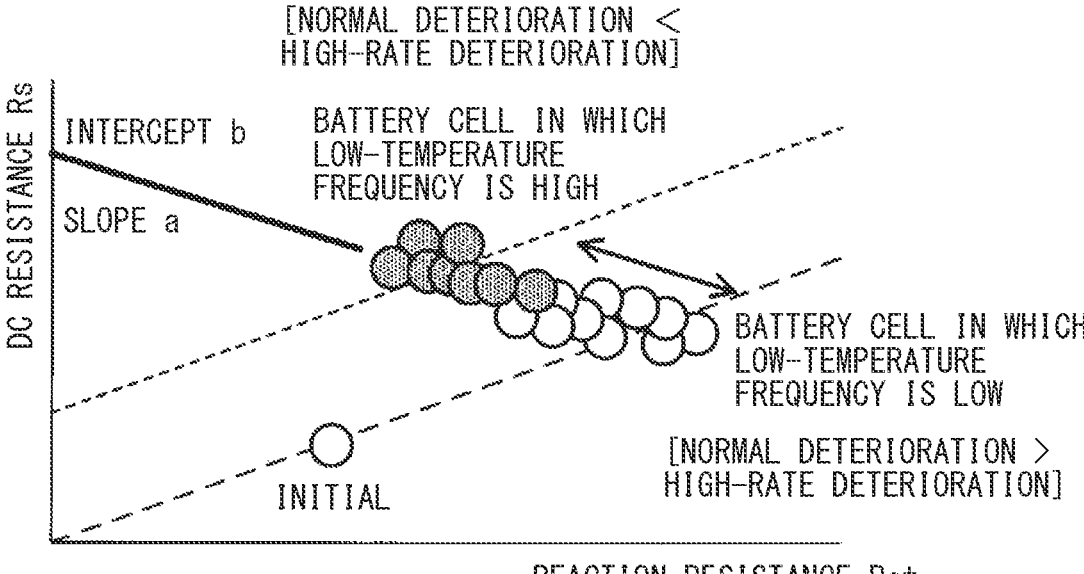
FIG. 10 is a graph showing a relationship between a DC resistance and a reaction resistance at the time of normal deterioration and at the time of specific deterioration of the secondary battery in the second embodiment.

As illustrated in FIG. 10, the deterioration states of the cells 101 of the secondary battery 10 are different from each other. In this case, the impedance characteristics may vary, because a temperature distribution occurs among the cells 101, when the number of cells increases, due to an arrangement or the like in the battery pack. The high-rate deterioration is more likely to progress as the temperature decreases. In contrast, the normal deterioration is more likely to occur at a higher temperature.

In FIG. 10, a coordinate plane has the reaction resistance Rct as the horizontal axis and the DC resistance Rs as the vertical axis. A combination of the DC resistance Rs and the reaction resistance Rct corresponding to each cell 101 is plotted as a set of coordinates (Rct, Rs). A variation occurs according to the deterioration state of the cell 101. That is, in the cell 101 having a high frequency of the low temperature, the degree of the normal deterioration is small, and the degree of the high-rate deterioration is large. On the other hand, in the cell 101 having a low frequency of the low temperature (that is, having a high frequency of high temperature), the degree of the normal deterioration is large, and the degree of the high-rate deterioration is small. At this time, the plural sets of coordinates are aligned on a substantially straight line having a negative slope from the characteristic line at the time of normal deterioration to the characteristic line at the time of high-rate deterioration in FIG. 10.

Therefore, an expression representing the relationship between the DC resistance Rs and the reaction resistance Rct is obtained from the plural sets of coordinates corresponding to the cells 101 as a linear expression approximated using, for example, a least squares method. A state in which the high-rate deterioration occurs in a part of the cells 101 can be detected using the slope "a" or the intercept "b" thereof. The index value calculator 22 uses the slope "a" of the linear expression as an index value, and the deterioration determiner 23 uses the slope threshold TH2 corresponding to the index value so as to determine the high-rate deterioration.

Figure 11:
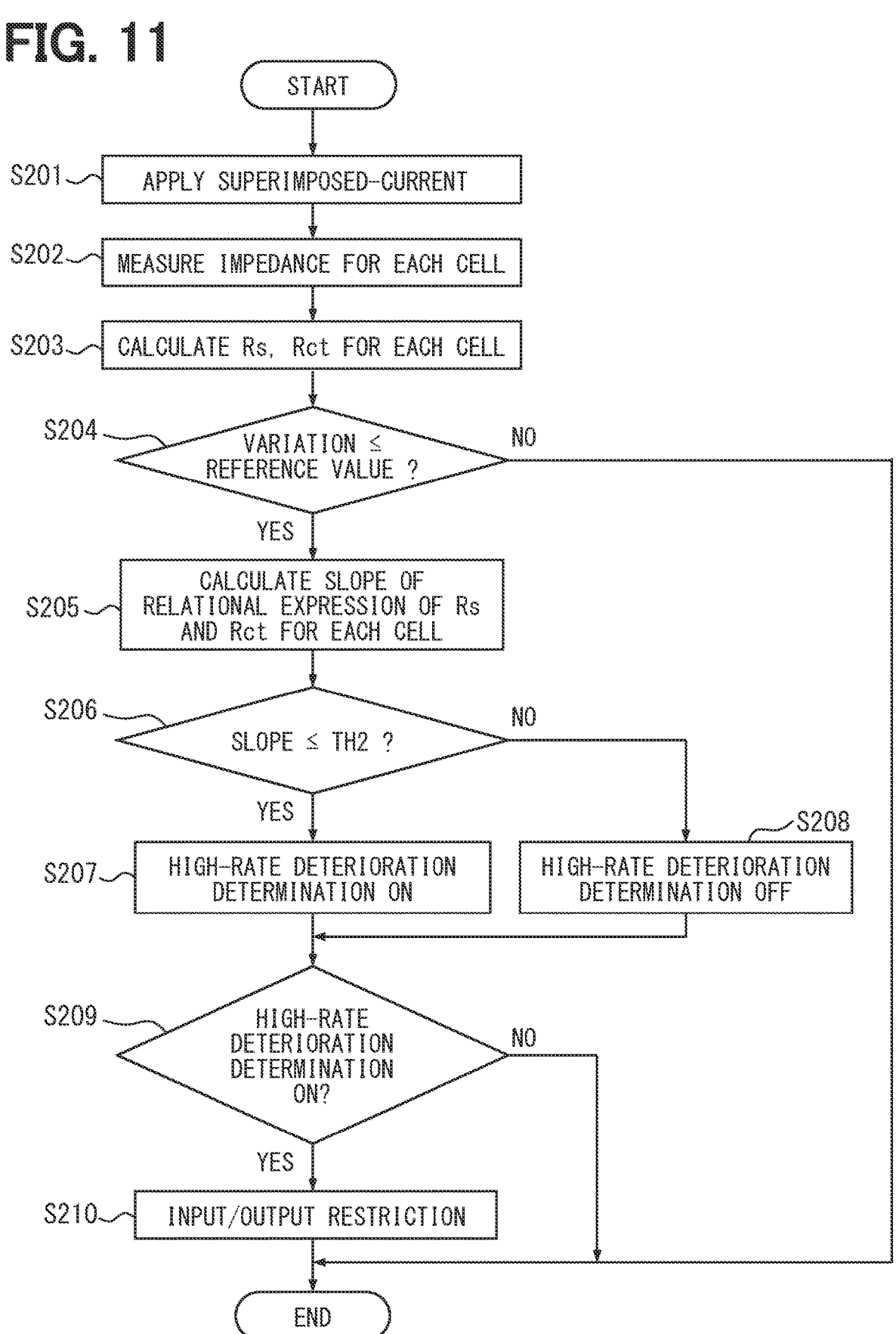
FIG. 11 is a flowchart illustrating a diagnostic procedure in a diagnostic unit of the control device according to the second embodiment.

Next, a control flow performed by the diagnosis unit 20 of the control device 1 of the present embodiment will be described with reference to FIG. 11. S201 to S203 are performed in the same manner as S101 to S103 in the first embodiment. First, in S201, a superimposed current in which plural frequency components are superimposed is applied to the secondary battery 10 by the superimposed current applying unit 211 of the resistance calculator 21. The waveform of the superimposed current may be a multiple sine wave. Next, in S202, the impedance measurement unit 212 acquires the battery voltage when the superimposed current is applied for each cell 101, and calculates the impedance for each cell 101 from the complex impedance plot.

Further, in S203, the DC resistance calculation unit 213 and the reaction resistance calculation unit 214 calculate the DC resistance Rs and the reaction resistance Rct for each cell 101 from the complex impedance plot. Subsequently, in S204, it is determined whether the calculated variation of the DC resistances Rs or the reaction resistances Rct is equal to or greater than a reference value.

As illustrated in FIG. 10, as the variation in the deterioration state of the cells 101 increases, the coordinates are linearly plotted from the characteristic line at the time of normal deterioration to the characteristic line at the time of high-rate deterioration. When the high-rate deterioration does not occur, the coordinates are plotted along the characteristic line at the time of normal deterioration. In order to calculate an expression representing the relationship between the impedances of the cells 101, it is desirable that the impedances have a certain degree of variation. Therefore, prior to the calculation of the index value, it is determined whether the variation in the DC resistance Rs or the variation in the reaction resistance Rct is in a state suitable for the calculation of the relational expression, using the reference value.

In S204, the reference value can be arbitrarily set. For example, based on the temperature distribution in the battery pack, the variation in the reaction resistance Rct is set 5% as a reference value. When the variation in the reaction resistance Rct is larger than or equal to 5%, it can be determined that the battery pack is in a state suitable for calculating the relational expression. When an affirmative determination is made in S204, the processor proceeds to S205. When a negative determination is made in S204, the control flow ends.

In S205, the index value calculator 22 calculates the slope of the relational expression serving as the index value from the combination of the DC resistance Rs and the reaction resistance Rct obtained for each cell 101. Specifically, plural sets of coordinates corresponding to the number of cells are plotted with the calculated DC resistance Rs as the vertical axis and the reaction resistance Rct as the horizontal axis. The slope is calculated by approximating the coordinates to a linear expression using a least squares method. Subsequently, in S206, the deterioration determiner 23 determines the presence or absence of high-rate deterioration based on whether or not the calculated slope is equal to or less than the slope threshold TH2 (slope s TH2?).

Figures 12, 13:
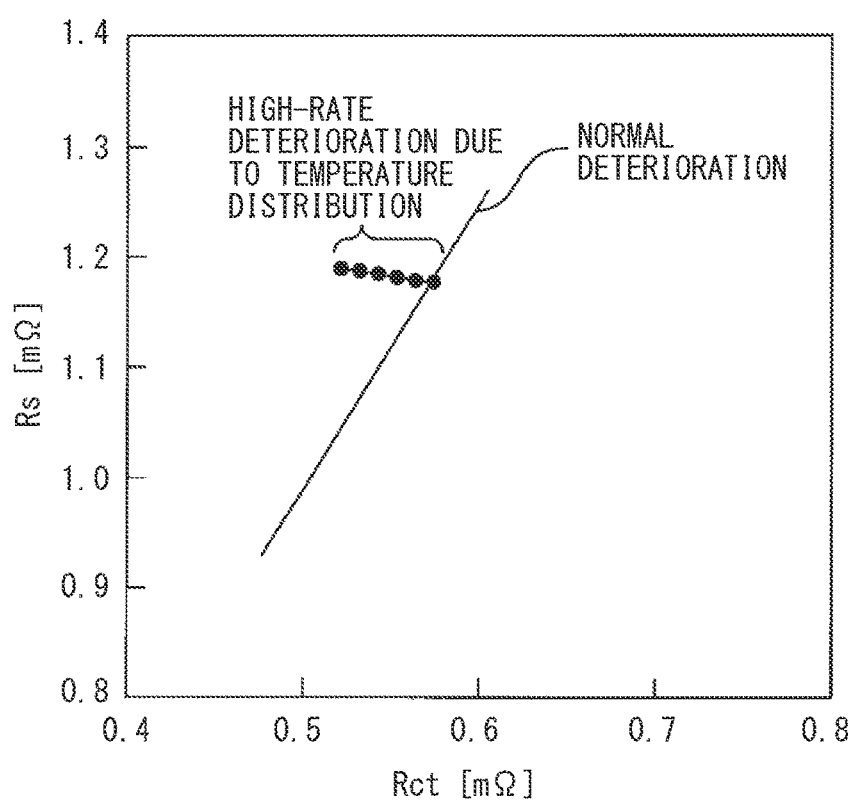
FIG. 12 is a graph showing a relationship between a DC resistance and a reaction resistance of each unit cell at the time of specific deterioration due to the temperature distribution of the secondary battery in the second embodiment.
FIG. 13 is a block diagram illustrating a control device for a secondary battery according to a third embodiment.

FIG. 12 shows, as an example, the relationship between the DC resistance Rs and the reaction resistance Rct of the cells 101 obtained by impedance measurement for the secondary battery 10 in which high-rate deterioration due to the temperature distribution has occurred. Table 3 shows the DC resistance Rs and the reaction resistance Rct of each cell and the ratio Rs/Rct thereof, and the slope and intercept of the linear expression obtained from the relationship therebetween are shown below.

Slope=−0.26
Intercept=1.32

TABLE 3

| High-rate deterioration due to temperature distribution | Rs[mΩ] | Rct[mΩ] | Rs/Rct |
|---|---|---|---|
| 1 (Low temperature) | 1.18 | 0.58 | 2.04 |
| 2 | 1.18 | 0.56 | 2.09 |
| 3 | 1.18 | 0.55 | 2.13 |
| 4 | 1.18 | 0.54 | 2.18 |
| 5 | 1.19 | 0.53 | 2.23 |
| 6 (High temperature) | 1.19 | 0.52 | 2.28 |

From FIG. 12 and Table 3, the reaction resistance Rct increases as the temperature of the cell 101 increases, and approaches the characteristic line at the time of normal deterioration. On the other hand, as the temperature of the cell 101 decreases, the reaction resistance Rct decreases and the DC resistance Rs shifts to a larger side. The slope of the equation obtained from the combination of the plural combinations of the DC resistance Rs and the reaction resistance Rct is a negative value (<0). Therefore, when the slope threshold TH2 is set to 0 or a value smaller than 0, it can be determined that high-rate deterioration occurs in at least a part of the secondary battery 10.

As described above, by comparing the impedances of the cells 101 of the secondary battery 10, it is possible to accurately determine the presence or absence of high-rate deterioration using the constant slope threshold TH2. In this case, since it is not necessary to consider the change in the DC resistance Rs and the reaction resistance Rct due to the normal deterioration, the detection accuracy of the high-rate deterioration is further improved. In Table 3, the ratio Rs/Rct obtained for each cell 101 has a larger value toward the low-temperature side, that is, as the high-rate deterioration progresses. It is possible to determine the degree of the normal deterioration or the high-rate deterioration comparing the ratios Rs/Rct of the cells 101.

The intercept threshold TH20 may be set based on FIG. 12 and Table 3, and the high-rate deterioration may be determined based on the calculated value of the intercept. In this case, since the expression indicating the relationship between the cells 101 shifts and the value of the intercept changes depending on the degree of normal deterioration, for example, the detection error can be reduced by setting the intercept threshold TH20 according to the maximum value of the reaction resistance Rct.

When an affirmative determination is made in S206, a determination flag of high-rate deterioration is turned on in S207, and the processor proceeds to S209. When a negative determination is made in S206, a determination flag of high-rate deterioration is turned off in S208, and the processor proceeds to S209. In S209, it is determined whether the determination flag of high-rate deterioration is on (high-rate deterioration determination ON?). When the determination is affirmative, the processor proceeds to S210. When a negative determination is made in S209, the diagnosis is ended.

When the processor proceeds to S210, in order to suppress the progress of the high-rate deterioration, the input/output current is restricted by the charge/discharge control unit 30. Thereafter, the control flow ends.

According to the control device 1 of the present embodiment, for the cells 101 of the secondary battery 10, the presence or absence of high-rate deterioration can be accurately diagnosed using the index value and the determination threshold representing the relationship between the DC resistance Rs and the reaction resistance Rct of the plural sets. At this time, the superimposed current is used for the impedance measurement to expedite the diagnosis speed. Further, the detection accuracy can be further improved on the condition that the state is set suitable for the diagnosis of the high-rate deterioration based on the variation of the DC resistance Rs or the reaction resistance Rct. Then, by reflecting the detection result of the high-rate deterioration in the charge/discharge control, the safety can be improved.

Third Embodiment

Next, the third embodiment of the control device 1 for the secondary battery 10 will be described with reference to FIGS. 13 to 15. As in the first embodiment, the control device 1 of the present embodiment illustrated in FIG. 13 includes the diagnosis unit 20, the charge/discharge control unit 30, the battery state monitor 40, and the memory 50. The diagnosis unit 20 includes the resistance calculator 21, the index value calculator 22, and the deterioration determiner 23. The basic configuration of a system in which the control device 1 is mounted on a vehicle together with the secondary battery 10 is the same as that of the first embodiment, and illustration thereof is omitted. Hereinafter, the differences will be mainly described.

In the present embodiment, the configuration of the secondary battery 10 is similar to that of the first embodiment, as a battery module in which each of the cells 101 includes the positive electrode 11, the negative electrode 12 and the electrolytic solution 13. The diagnosis unit 20 determines the presence or absence of high-rate deterioration for the cells 101 of the secondary battery 10 or the secondary battery 10 using an index value representing changes in the DC resistance Rs and the reaction resistance Rct. The resistance calculator 21 includes the superimposed current applying unit 211, the impedance measurement unit 212, the DC resistance calculation unit 213, and the reaction resistance calculation unit 214, and calculates the DC resistance Rs and the reaction resistance Rct of the secondary battery 10 in the same manner as in the first embodiment.

The index value calculator 22 uses a change amount $\Delta Rs$ or a change rate $\Delta Rs/\Delta t$ of the DC resistance Rs over time and a change amount $\Delta Rct$ of the reaction resistance Rct over time as an index value representing changes in the DC resistance Rs and the reaction resistance Rct. In the deterioration determiner 23, the determination threshold corresponding to the index value can be a first threshold TH3 set based on the change in the DC resistance Rs at the time of the specific deterioration with respect to the normal deterioration, and a second threshold TH4 set based on the change in the reaction resistance Rct at the time of the specific deterioration with respect to the normal deterioration.

When the change amount $\Delta Rs$ or the change rate $\Delta Rs/\Delta t$ of the DC resistance Rs is equal to or less than the first threshold TH3 and the change amount $\Delta Rct$ of the reaction resistance Rct is equal to or less than the second threshold TH4, the deterioration determiner 23 can determine that the specific deterioration has occurred.

Figure 14:
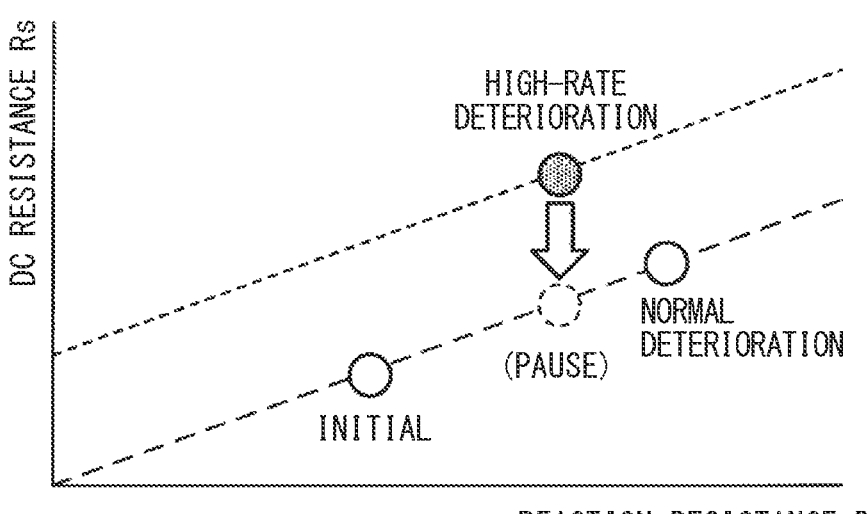
FIG. 14 is a graph showing a relationship between a DC resistance and a reaction resistance at the time of normal deterioration and at the time of specific deterioration of the secondary battery in the third embodiment.

As shown in FIG. 14, when the high-rate deterioration occurs while the deterioration progresses from the initial state, the DC resistance Rs temporarily increases with respect to the characteristic line at the time of normal deterioration. Thereafter, when charging and discharging are stopped, the high-rate state is gradually eliminated, and the DC resistance Rs decreases. When the increase amount of the DC resistance Rs due to the high-rate deterioration decreases, it returns to the characteristic line at the time of normal deterioration. On the other hand, at the time of normal deterioration, the resistance change due to the pause is not observed. That is, when the change in the impedance during the pause is monitored, if the decrease in the DC resistance Rs is observed while the reaction resistance Rct does not change or the change is small, it can be determined that the high-rate deterioration has occurred.

Therefore, the change amount $\Delta Rs$ or the change rate $\Delta Rs/\Delta t$, which is a change amount $\Delta Rs$ per unit time, of the DC resistance Rs is used as a value representing the change of the DC resistance Rs over time, and is compared with the first threshold TH3 set in advance. Further, the change amount $\Delta Rct$ of the reaction resistance Rc is used as a value representing the change of the reaction resistance Rc over time, and is compared with the second threshold TH4 set in advance. The first threshold TH3 and the second threshold TH4 may be set so as to be able to distinguish between the high-rate deterioration and the normal deterioration on the basis of the relationship illustrated in FIG. 14, and the presence or absence of the high-rate deterioration can be determined from both of comparison results.

Specifically, when the high-rate deterioration state is eliminated and transitions to the normal deterioration state, the DC resistance Rs decreases and the change amount $\Delta Rs$ becomes a negative value. Then, the first threshold TH3 is also a negative value (TH3<0), and is appropriately set so as to be a value at which the decrease of the DC resistance Rs can be reliably determined in consideration of measurement variation or the like. In this case, since there is almost no change in the reaction resistance Rc, the second threshold TH4 can be appropriately set in consideration of self-discharge or the like to be in a range (such as, within 5%) in which it can be determined that the change amount $\Delta Rct$ of the reaction resistance Rc is sufficiently small.

Next, a control flow performed by the diagnosis unit 20 of the control device 1 of the present embodiment will be described with reference to FIG. 15. This control flow is preferably performed, for example, in a pause state of the secondary battery 10, where the DC resistance Rs temporarily increases due to high-rate deterioration and a phenomenon in which the DC resistance Rs decreases can be detected. Specifically, the pause state means a state in which a stable state without energization lasts for 15 minutes or more, preferably 30 minutes or more. At this time, it is possible to accurately detect a decrease in the DC resistance Rs due to the stop of charging and discharging. In addition, it is desirable to be in an environment capable of suppressing the influence on the DC resistance Rs. For example, the deterioration diagnosis may be permitted when the temperature variation in the battery pack or the change amount of the temperature variation with time is within a predetermined range. For example, the allowable range of the temperature variation can be set to about ±2° C. corresponding to the detection accuracy of the temperature sensor S3.

Figure 15:
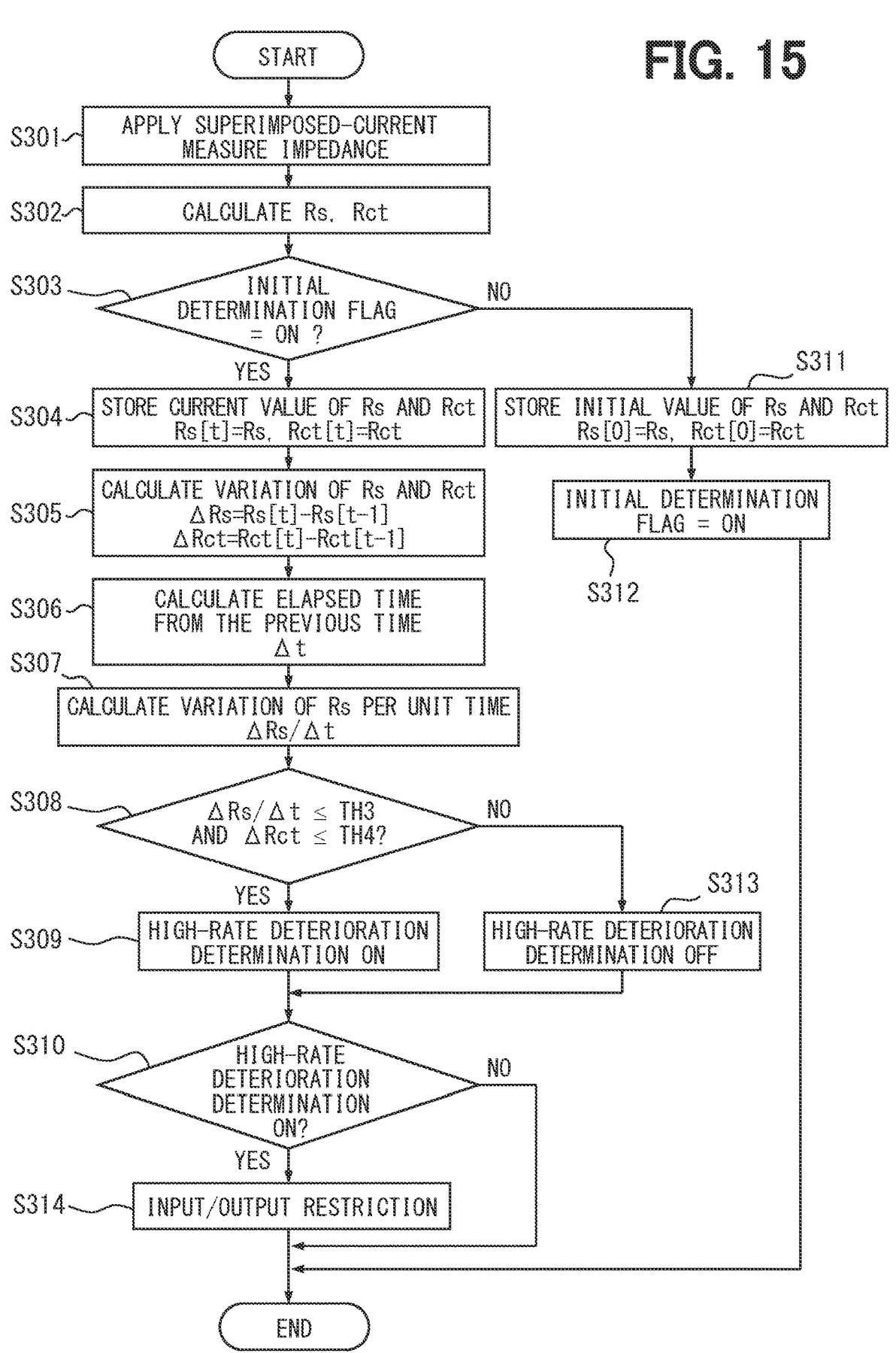
FIG. 15 is a flowchart illustrating a diagnosis procedure in a diagnosis unit of the control device according to the third embodiment.

In FIG. 15, S301 to S302 are performed in the same manner as S101 to S103 in the first embodiment. First, in S301, a superimposed current in which plural frequency components are superimposed is applied to the secondary battery 10 by the superimposed current applying unit 211 of the resistance calculator 21. Next, the impedance measurement unit 212 acquires the battery voltage when the superimposed current is applied, and calculates the impedance from the complex impedance plot. Further, in S302, the DC resistance Rs and the reaction resistance Rct are calculated from the complex impedance plot by the DC resistance calculation unit 213 and the reaction resistance calculation unit 214.

Subsequently, in S303, it is determined whether the initial determination flag is turned on. The initial determination flag is to be set in S311 and S312 to be described later. When an affirmative determination is made in S303, the processor proceeds to S304. In this case, since the previously-calculated DC resistance Rs and reaction resistance Rct are stored, the index value is calculated based on a change in the calculated value in S303 and subsequent steps.

In S304, the DC resistance Rs and the reaction resistance Rct calculated in S303 are stored in the memory 50 as the current value [t].

$$Rs[t]=Rs,Rct[t]=Rct$$

Subsequently, in S305, the change amount (variation) ΔRs of the DC resistance Rs and the change amount (variation) ΔRct of the reaction resistance Rct are calculated using the current value [t] and the previous value [t−1].

$$\Delta Rs=Rs[t]-Rs[t-1]$$

$$\Delta Rct=Rct[t]-Rct[t-1]$$

Further, in S306, the elapsed time Δt from the previous time is calculated. In S307, the change rate ΔRs/Δt, which is the variation in the DC resistance Rs per unit time, is calculated.

When a negative determination is made in S303, the processor proceeds to S311. In this case, since the initial determination flag is turned off and it is determined that the current calculation of the DC resistance Rs and the reaction resistance Rct is the initial calculation, the calculated value is stored in the memory 50 as the initial value [0] in S311.

$$Rs[0]=Rs,Rct[0]=Rct$$

Next, the processor proceeds to S312, in which the initial determination flag is turned on, and the control flow ends.

In S308, it is determined whether the change rate ΔRs/Δt is equal to or less than the first threshold TH3 and the change amount ΔRct is equal to or less than the second threshold TH4 (ΔRs/Δt≤TH3 and ΔRct≤TH4?). When an affirmative determination is made in S308, a determination flag of high-rate deterioration is turned on in S309, and the processor proceeds to S310. When a negative determination is made in S308, a determination flag of high-rate deterioration is turned off in S313, and the processor proceeds to S310.

In S310, it is determined whether the determination flag of the high-rate deterioration is on (high-rate deterioration determination ON?). When the determination is affirmative, the processor proceeds to S314. When a negative determination is made in S310, the diagnosis is ended.

When the processor proceeds to S314, in order to suppress the progress of the high-rate deterioration, the input/output current is restricted by the charge/discharge control unit 30. Thereafter, the control flow ends.

According to the control device 1 of the present embodiment, it is possible to accurately diagnose the presence or absence of the high-rate deterioration using the index value indicating the change in the DC resistance Rs and the reaction resistance Rct of the secondary battery 10 and the determination threshold. In this case, the superimposed current is used for the impedance measurement to raise the diagnosis speed. The detection accuracy can be further improved on condition that the state is suitable for the diagnosis of the high-rate deterioration. Then, by reflecting the detection result of the high-rate deterioration in the charge/discharge control, the safety can be improved.

The present disclosure is not limited to the embodiments described above, and various modifications may be adopted within the scope of the present disclosure without departing from the spirit of the disclosure. For example, the secondary battery 10 includes the positive electrodes 11, the negative electrode 12 and the electrolytic solution 13, but may be an all-solid battery including a solid electrolyte. In addition, the configuration of the system in which the secondary battery 10 is mounted on the vehicle can be arbitrarily changed. For example, the secondary battery 10 may be provided chargeable by an onboard or external charger.

Although the present disclosure has been described in accordance with the embodiments, it is understood that the present disclosure is not limited to such embodiments or structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. A control device for a secondary battery including an electrode and an electrolyte, the control device comprising a processor configured to implement:

a diagnosis unit configured to diagnose a deterioration state of the secondary battery, wherein the diagnosis unit has:

a resistance calculator configured to calculate a direct current resistance and a reaction resistance based on an impedance measurement result of the secondary battery by an alternating current impedance method;

an index value calculator configured to calculate an index value related to the direct current resistance and the reaction resistance;

a deterioration determination unit configured to compare the index value with a determination threshold based on an impedance characteristic at a time of deterioration of the secondary battery so as to determine a specific deterioration associated with charging and discharging of the secondary battery; and a charge and/or discharge control unit configured to control charging and/or discharging of the secondary battery by limiting a charge and/or discharge current when the deterioration determination unit determines that the specific deterioration has occurred;

wherein:

the secondary battery is configured as a battery module in which a plurality of single cells is combined, each of which including the electrode and the electrolyte, the resistance calculator calculates the direct current resistance and the reaction resistance for each of the plurality of single cells, and the index value calculator calculates the index value as a value representing a relationship between a plurality of calculated sets of the direct current resistance and the reaction resistance.

2. The control device according to claim 1, wherein:

the index value calculator calculates the index value as a slope or an intercept of an expression representing a relationship between a plurality of sets of the direct current resistance and the reaction resistance, the deterioration determination unit compares the index value with a slope threshold or an intercept threshold set based on an expression representing the relationship between the plurality of calculated sets of the direct current resistance and the reaction resistance in the plurality of single cells at the time of deterioration, and the deterioration determination unit determines that the specific deterioration has occurred when the slope is equal to or less than the slope threshold or when the intercept is equal to or more than the intercept threshold.

3. The control device according to claim 1, wherein:

the deterioration determination unit permits a deterioration determination when at least one variation in the direct current resistances or the reaction resistances corresponding to the plurality of single cells is equal to or greater than a reference value.

4. The control device according to claim 3, wherein:

the index value calculator calculates the index value as a change amount or a change rate of the direct current resistances over time and a change amount of the reaction resistances over time, the deterioration determination unit compares the index value with a first threshold set based on a change in the direct current resistances at the time of specific deterioration with respect to the time of deterioration, and a second threshold set based on a change in the reaction resistances at the time of specific deterioration with respect to the time of deterioration, and the deterioration determination unit determines that the specific deterioration has occurred when a change amount or a change rate of the direct current resistances is equal to or less than the first threshold and a change amount of the direct current resistances is equal to or less than the second threshold.

5. The control device according to claim 4, wherein the deterioration determination unit permits a deterioration determination when the secondary battery is in a stable state and not being charged or when a temperature variation of the secondary battery or a change amount of the temperature variation over time is equal to or less than a reference value.

6. The control device according to claim 1, wherein:

when a capacity of the secondary battery is defined as C, the resistance calculator applies a current to acquire an impedance measurement.

7. The control device according to claim 1, wherein:

when a superimposed current in which a plurality of frequency components is superimposed is applied to the secondary battery, the resistance calculator acquires the impedance measurement result for each of the frequency components.

* * * * *